United States Patent [19]
Park et al.

[11] Patent Number: 5,545,578
[45] Date of Patent: Aug. 13, 1996

[54] METHOD OF MAUFACTURING A SEMICONDUCTOR DEVICE HAVING A LOW RESISTANCE GATE ELECTRODE

[75] Inventors: Young-hoon Park; Young-woo Seo, both of Kyungki-do; Yong-hee Lee, Seoul, all of Rep. of Korea

[73] Assignee: Samsung Electronics Co., Ltd., Suwon, Rep. of Korea

[21] Appl. No.: 440,954

[22] Filed: May 15, 1995

[30] Foreign Application Priority Data

Jun. 8, 1994 [KR] Rep. of Korea ............... 94-12853

[51] Int. Cl.⁶ .............................. H01L 21/8234
[52] U.S. Cl. .................. 437/44; 437/241; 437/913; 437/983
[58] Field of Search ............... 437/44, 36, 913, 437/29, 983, 241; 148/DIG. 117, DIG. 147

*Primary Examiner*—Brian E. Hearn
*Assistant Examiner*—Michael Trinh
*Attorney, Agent, or Firm*—Robert A. Westerlund; Allen LeRoy Limberg; Charles R. Donohoe

[57] ABSTRACT

A method for manufacturing a semiconductor device, e.g., an LDD transistor, which includes the steps of forming a gate insulating layer on a semiconductor substrate, forming a polysilicon layer on the gate insulating layer, forming a silicide layer on the polysilicon layer, etching the silicide layer to form a gate-patterned silicide layer, and over-etching the silicide layer to partially etch the polysilicon layer, to thereby form a step in the polysilicon layer, forming an oxidation-prevention spacer on sidewalls of the gate-patterned silicide layer and sidewalls of the polysilicon layer exposed by the step, etching the polysilicon layer, using the oxidation-prevention spacer as an etching mask, to thereby form a gate-patterned polysilicon layer, the gate-patterned silicide layer and the gate-patterned polysilicon layer together comprising a gate electrode, thermally oxidizing exposed portions of the gate insulating layer and exposed portions of the polysilicon layer, to thereby form an oxide layer, and, ion-implanting impurities into the semiconductor substrate, using the resultant structure as an ion-implantation mask, to thereby form source/drain regions in the semiconductor substrate, on opposite sides of the gate electrode.

33 Claims, 12 Drawing Sheets

METHOD OF MAUFACTURING A SEMICONDUCTOR DEVICE HAVING A LOW RESISTANCE GATE ELECTRODE

BACKGROUND OF THE INVENTION

The present invention relates generally to a method for manufacturing a semiconductor device, and, more particularly, to a method for manufacturing a semiconductor device having a low-resistance gate electrode.

From the initial stages of development of VLSI (Very Large Scale Integration) technology to the present, gate electrodes made of polysilicon have been employed because of their advantageous electrical characteristics, reliability, and packing density. Further, since polysilicon is a refractory material, it is possible to use the polysilicon gate electrode to simultaneously form self-aligned source/drain diffusion regions of the semiconductor device in a precise manner. This self-aligned gate process technology facilitates easier and more efficient manufacturability of the semiconductor device, and enhances the performance and reliability of the semiconductor device. Additionally, since polysilicon can be thermally oxidized after being patterned into a gate electrode, it is possible to smooth the edges of the gate electrode which are susceptible to damage caused by reactive ion etching, and, at the same time, to alleviate fringe electric fields at the edges of the gate electrode, thereby further enhancing the reliability of the semiconductor device. For these reasons, polysilicon gate electrodes are widely used in the vast majority of VLSI chips, including high-density memory chips (e.g., DRAMs and SRAMs) and other chips used in computers and a wide variety of products.

However, in ULSI (Ultra Large Scale Integration) devices having sub-micron geometries (i.e., manufactured using a design rule of<1<1 μm), the polysilicon gate structure nullifies the increased device operational speed obtained by virtue of the higher packing densities characteristic of ULSI devices. In this regard, the polysilicon gate structure induces delays in signal transmission due to an increase in the wiring resistance of the device as a consequence of its miniaturization, and an increase in the wiring capacitance as a consequence of the reducing wiring pitch.

For these reasons, alternative materials to polysilicon, such as refractory silicides are now being used in some ULSI devices, because of their much lower resistance than polysilicon. In fact, some refractory silicides, such as tungsten silicide/$n^+$ polysilicon, has a greater than one order of magnitude (i.e., more than one decimal place) lower resistance than polysilicon.

Figure 1A:
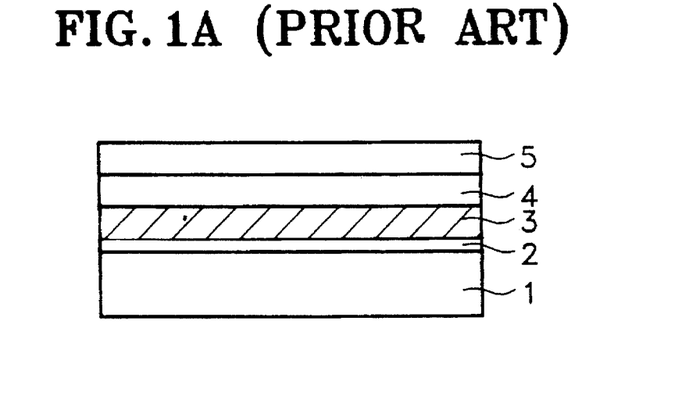
FIGS. 1A, 1B, and 1C are cross-sectional views depicting successive steps of a conventional method for manufacturing a refractory silicide gate electrode.
Figure 1B:
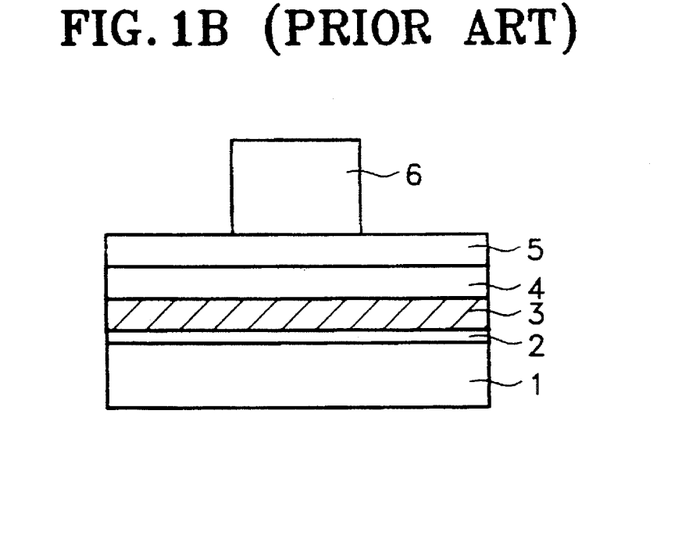
Figure 1C:
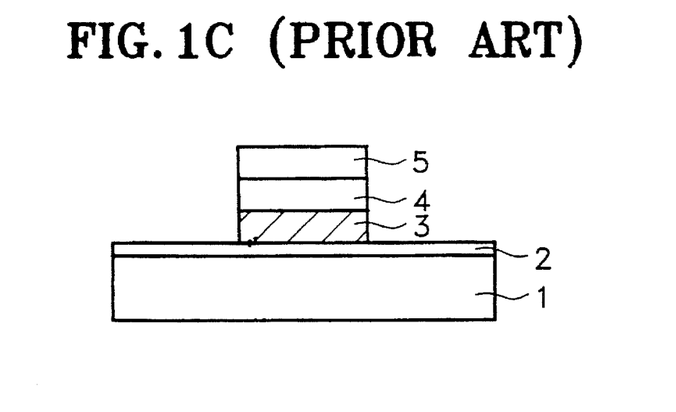

With reference now to FIGS. 1A, 1B, and 1C, there can be seen cross-sectional views depicting successive steps of a method for manufacturing a semiconductor device utilizing the tungsten silicide/$n^+$ polysilicide gate electrode technology.

With reference now to FIG. 1A, a gate insulating layer 2 is formed on a semiconductor substrate I by way of a thermal oxidation process. An $n^+$ doped polysilicon layer 3 is formed on the gate insulating layer 2 to a thickness of 500–5,000 angstroms. Next, a tungsten silicide layer 4 is formed on the doped polysilicon layer 3, and then, an oxide layer 5 is formed on the tungsten silicide layer 4.

With reference now to FIG. 1B, a photoresist pattern 6 for defining a gate electrode is formed on the oxide layer 5, by way of a standard photolithograhic process.

With reference now to FIG. 1C, using the photoresist pattern 6 as an etching mask, the oxide layer 5, tungsten silicide layer 4, and polysilicon layer 3 are sequentially etched, by way of a standard reactive ion etching process, and then, the photoresist is removed, to thereby leave a gate electrode comprised of the tungsten silicide layer 4 and the $n^+$ polysilicon layer 3.

Figure 2:
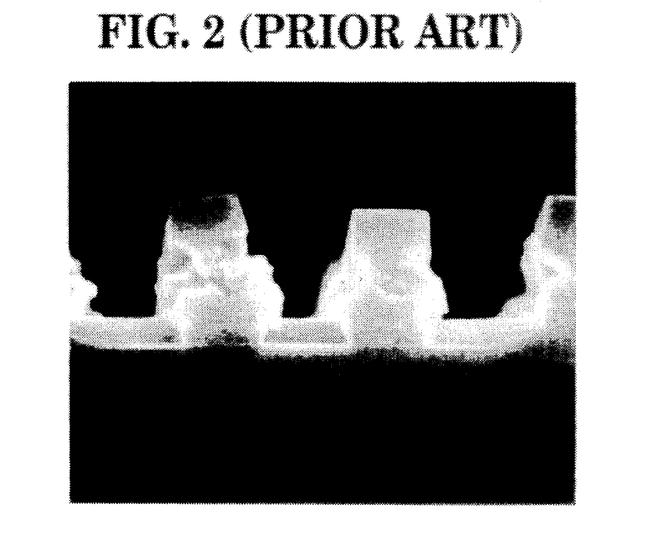
FIG. 2 is an SEM photograph of a refractory silicide gate electrode made by the method depicted in FIGS. 1A, 1B, and 1C.
Figure 3:
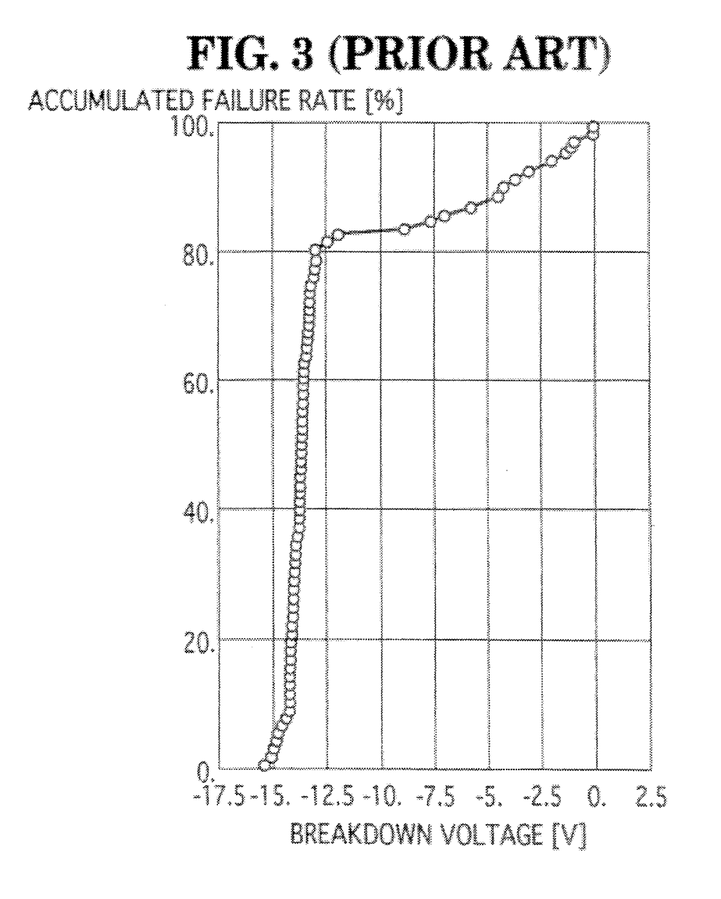
FIG. 3 is a graph depicting the breakdown voltage characerstic of the gate insulating layer of the refractory silicide gate electrode made by the method depicted in FIGS. 1A, 1B, and 1C.

The above-described method for forming a tungsten silicide/$n^+$ polysilicon gate electrode is simpler and produces a much lower resistance gate electrode than the conventional method for forming a polysilicon gate electrode. However, the above-described method for forming a tungsten silicide/$n^+$ polysilicon gate electrode is disadvantageous in that a thermal oxidation process can not be performed to compensate for damage to the gate electrode caused by subsequent reactive ion etching steps of the overall process for manufacturing the semiconductor device of which the gate electrode is a part. In this regard, if the exposed portion of the tungsten silicide layer is subjected to thermal oxidation, it becomes highly degraded due to the volume expansion thereof, as can be seen in the SEM photograph of FIG. 2. If thermal oxidation step is omitted in order to avoid such problems, the gate insulating layer becomes highly degraded due to damage occasioned by the reactive ion etching step for patterning the gate electrode. Moreover, when voltage is applied to the gate electrode, the fringe electric field created at the edges of the gate electrode is increased, thus degrading the breakdown voltage characteristic of the gate insulating layer, which can cause malfunction of the entire semiconductor device.

Based on the above and foregoing, it can be appreciated that there presently exists a need in the art for a method for manufacturing a semiconductor device having a low-resistance gate electrode which eliminatges the above-described drawbacks and shortcomings of the presently available technology. The present invention fulfills this need.

SUMMARY OF THE INVENTION

The present invention encompasses a method for manufacturing a semiconductor device, e.g., an LDD transistor, which includes the steps of forming a gate insulating layer on a semiconductor substrate, forming a polysilicon layer on the gate insulating layer, forming a silicide layer on the polysilicon layer, etching the silicide layer to form a gate-patterned silicide layer, and over-etching the silicide layer to partially etch the polysilicon layer, to thereby form a step in the polysilicon layer, forming an oxidation-prevention spacer on sidewalls of the gate-patterned silicide layer and sidewalls of the polysilicon layer exposed by the step, etching the polysilicon layer, using the oxidation-prevention spacer as an etching mask, to thereby form a gate-patterned polysilicon layer, the gate-patterned silicide layer and the gate-patterned polysilicon layer together comprising a gate electrode, thermally oxidizing exposed portions of the gate insulating layer and exposed portions of the polysilicon layer, to thereby form an oxide layer, and, ion-implanting impurities into the semiconductor substrate, using the resultant structure as an ion-implantation mask, to thereby form source/drain regions in the semiconductor substrate, on opposite sides of the gate electrode. In a first preferred embodiment, the method of the present invention further includes the step of forming an oxidation-prevention layer, e.g., a nitride layer, on the silicide layer, prior to the first etching step. In a second preferred embodiment, the method of the present invention further includes the step of forming an insulating layer, e.g., an oxide layer, on the silicide layer, prior to the first etching step. In a third preferred embodiment, the method of the present invention further includes the steps of forming an oxidation-prevention layer, e.g., a nitride layer, on the silicide layer, prior to the first etching step, and forming an insulating layer, e.g., an oxide layer, on the oxidation-prevention layer.

In a fourth embodiment, the method of the present invention includes the steps of forming a gate insulating layer on a semiconductor substrate, forming a polysilicon layer on the gate insulating layer, forming a silicide layer on the polysilicon layer, forming an insulating layer on the silicide layer, etching the insulating layer and the silicide layer, to form a gate-patterned insulating layer, undercut-etching the silicide layer to form a gate-patterned silicide layer having a lesser width than that of the gate-patterned insulating layer, and over-etching the silicide layer to partially etch the polysilicon layer, to thereby form a step in the polysilicon layer, forming an oxidation-prevention spacer on sidewalls of the gate-patterned insulating layer, sidewalls of the gate-patterned silicide layer, and sidewalls of the polysilicon layer exposed by the step, etching the polysilicon layer, using the oxidation-prevention spacer as an etching mask, to thereby form a gate-patterned polysilicon layer, the gate-patterned silicide layer and the gate-patterned polysilicon layer together comprising a gate electrode, thermally oxidizing exposed portions of the gate insulating layer and exposed portions of the polysilicon layer, to thereby form an oxide layer, and, ion-implanting first impurities into the semiconductor substrate, using the resultant structure as an ion-implantation mask, to thereby form source/drain regions in the semiconductor substrate, on opposite sides of the gate electrode, In each of the preferred embodiments, the method of the present invention preferably includes the further steps of forming a further spacer on sidewalls of the oxidation-prevention spacer, and, ion-implanting second impurities into the semiconductor substrate, to a greater depth than the first impurities, using the further spacer as an ion-implantation mask, to thereby form deeper source/drain regions in the semiconductor substrate, on opposite sides of the gate electrode.

BRIEF DESCRIPTION OF THE DRAWINGS

These and various other features and advantages of the present invention will be readily understood with reference to the following detailed description taken in conjunction with the accompnaying drawings, wherein like reference numerals designate like structural elements, and, in which.

DETAILED DESCRIPTION OF THE INVENTION

With reference now to FIGS. 4A–4H, a method for manufacturing a semiconductor device in accordance with a first preferred embodiment of the present invention will now be described.

Figure 4A:
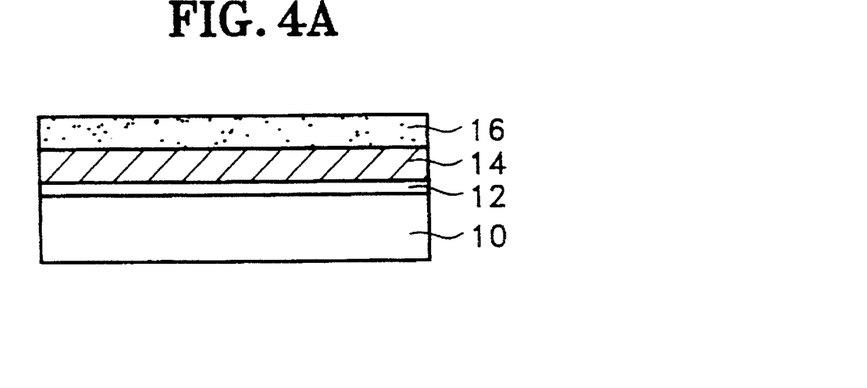
FIGS. 4A–4H are cross-sectional views depicting successive steps of a method for manufacturing a semiconductor device in accordance with a first preferred embodiment of the present invention.

With specific reference to FIG. 4A, a gate insulating layer 12 is formed on a semiconductor substrate 10, e.g., by way of a thermal oxidation process. Then, an $n^+$-doped polysilicon layer 14 is formed on the gate insulating layer 12, to a thickness of 500–5,000 angstroms. Next, a refractory silicide layer, preferably a tungsten silicide (WSix)layer 16 is formed on the doped polysilicon layer 14, to a thickness of 500–5,000 angstroms, e.g., by way of an ordinary chemical vapor deposition (CVD) process.

Figure 4B:
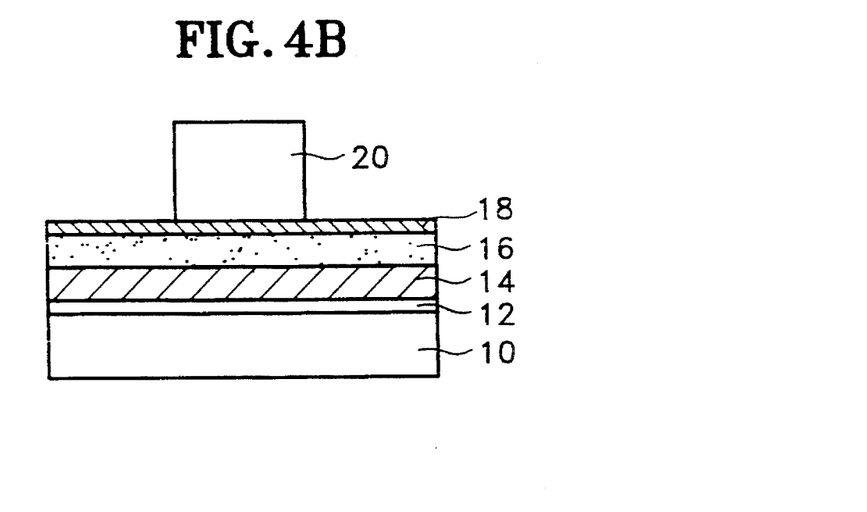

With specific reference to FIG. 4B, an insulating material, e.g., a nitride material, is deposited on the tungsten silicide layer 16, to a thickness of 50–2,000 angstroms, e.g., by way of a CVD process, to thereby form a first oxidation-prevention layer 18 on the tungsten silicide layer 16. Next, a photoresist pattern 20 for defining a gate electrode is formed on the first oxidation-prevention layer 18, e.g., by way of a standard photolithographic process.

Figure 4C:
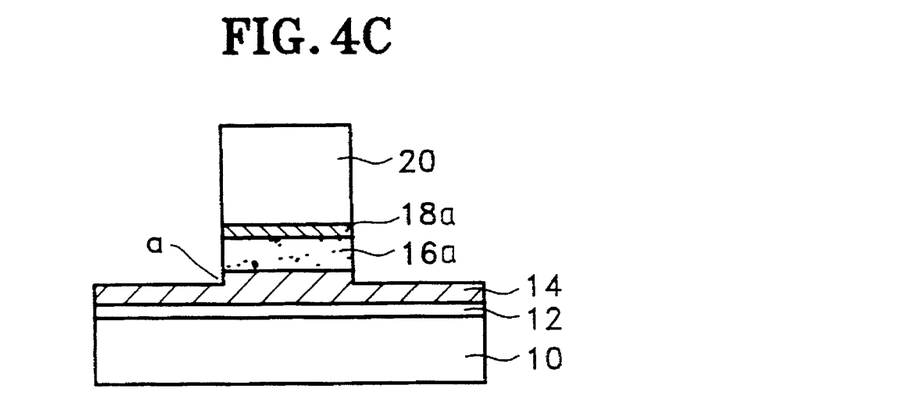

With specific reference now to FIG. 4C, the first oxidation-prevention layer 18 and the tungsten silicide layer 16 are sequentially etched, e.g., dry etched, using the photoresist pattern 20 as an etching mask, to thereby form a gate-patterned first oxidation-prevention layer 18a and a gate-patterned tungsten silicide layer 16a. The tungsten silicide layer 16 is over-etched, and then, the doped polysilicon layer 14 is etched to a depth of 100–1,000 angstroms, to thereby form a step "a" in the doped polysilicon layer 14.

Figure 4D:
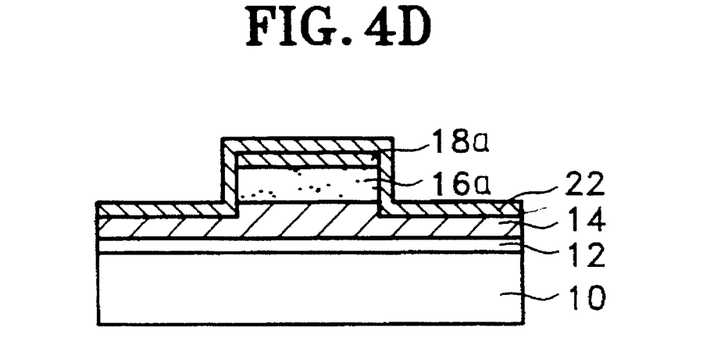

With specific reference now to FIG. 4D, the photoresist pattern 20 is removed, and then, an insulating material, e.g., a nitride material, is deposited on the resultant structure, to a thickness of 50–500 angstroms, e.g., by way of a CVD method, to thereby form a second oxidation-prevention layer 22.

Figure 4E:
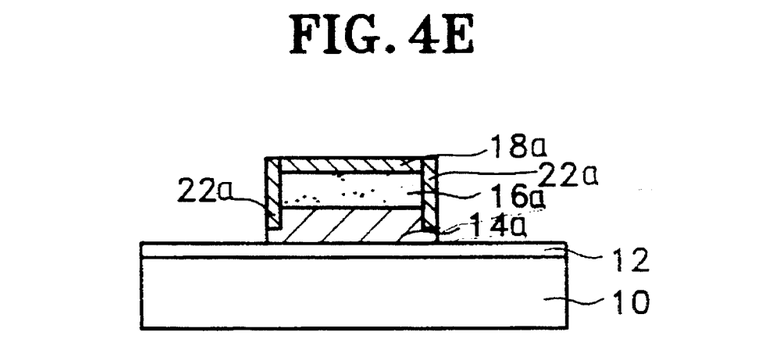

With specific reference now to FIG. 4E, the second oxidation-prevention layer 22 is anisotropically etched to form an oxidation-prevention spacer 22a on the sidewalls of the gate-patterned first oxidation-prevention layer 18a, the sidewalls of the gate-patterned tungsten silicide layer 16a, and the sidewalls of an upper portion of the doped polysilicon layer 14 exposed by the step "a". Next, using the oxidation-prevention spacer 22a as an etching mask, the doped polysilicon layer 14 is etched, to thereby form a gate-patterned doped polysilicon layer 14a. Together, the gate-patterned layers ("gate layers") 14a, 16a comprise a gate electrode.

Figure 4F:
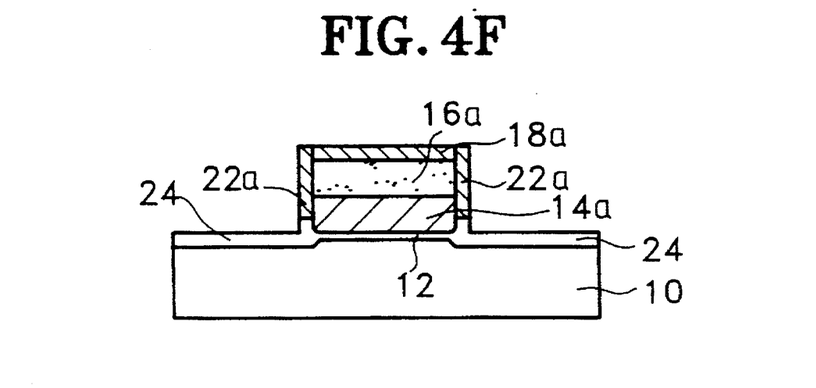

With reference now to FIG. 4F, the resultant structure of FIG. 4E is subjected to thermal oxidation, whereby the exposed step portion "a" of the polysilicon gate layer 14a and the exposed portions of the oxide layer 12 are oxidized inwardly to a depth of 50–500 angstroms, to thereby form an oxide layer 24. The tungsten silicide gate layer 16a and the upper portion of the polysilicon gate layer 14a are protected against oxidation by the first oxidation-prevention layer 18a and the oxidation-prevention spacer 22a. As can be seen, the oxide layer 24 is formed thicker on the edges of the gate electrode in order to compensate for etch losses which occur when patterning the gate electrode.

Figure 4G:
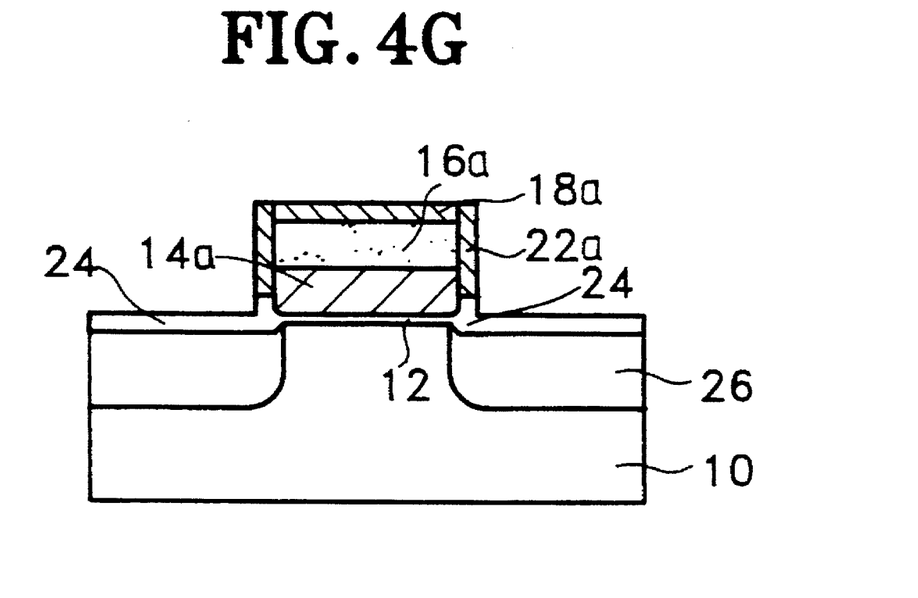

With reference now to FIG. 4G, $n^-$ impurities are ion-implanted into the semiconductor substrate 10 through the oxide layer 24, using the resultant structure depicted in FIG. 4F as an ion-implantation mask, to thereby form $n^-$ source/drain regions 26 on opposite sides of the gate electrode.

Figure 4H:
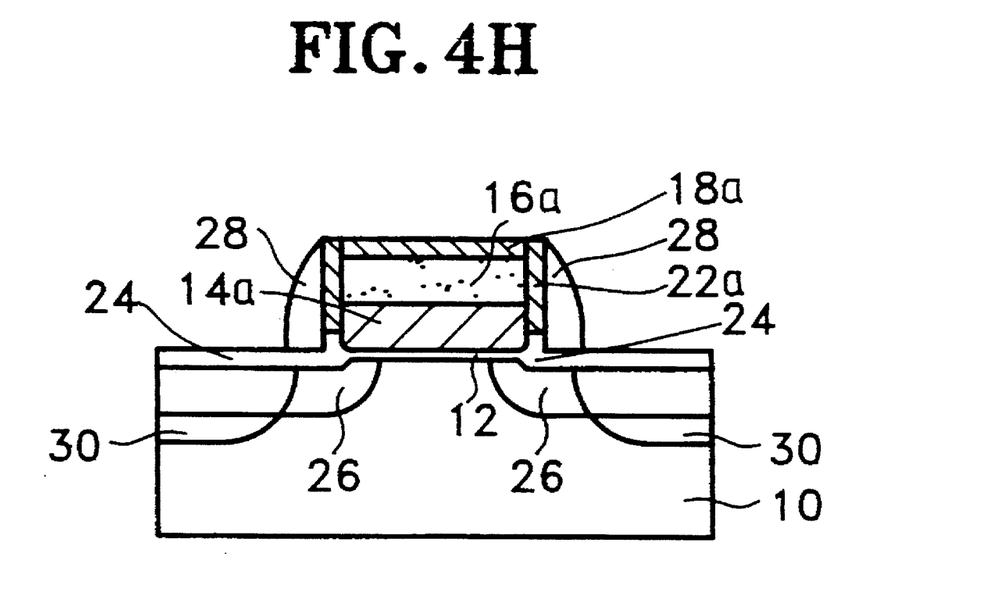

With reference now to FIG. 4H, an insulating material, e.g., an oxide material, is deposited on the resultant structure depicted in FIG. 4G, to a thickness of 500–3,000 angstroms. The thusly obtained insulating layer (not shown in its entirety) is anisotropically etched to thereby form a spacer 28 on the sidewalls of the oxidation-prevention spacer 22a. Next, $n^+$ impurities are ion-implanted into the semiconductor substrate 10 through the oxide layer 24, using the spacer 28 as an ion-implantation mask, to thereby form $n^+$ source/drain regions 30 on opposite sides of the gate electrode. The source/drain regions 26, 40 and the gate electrode together comprise a lightly doped drain (LDD) transistor. It should be recognized, however, that the steps depicted in FIGS. 4G and 4H for forming a lightly doped drain (LDD) transistor are only illustrative, as the present invention is not limited to the manufacture of any specific type of transistor or other type of semiconductor device (e.g., semiconductor diode, resistor, capacitor, memory cell, etc.).

With reference now to FIGS. 5A–5E, a method for manufacturing a semiconductor device in accordance with a second preferred embodiment of the present invention will now be described.

Figure 5A:
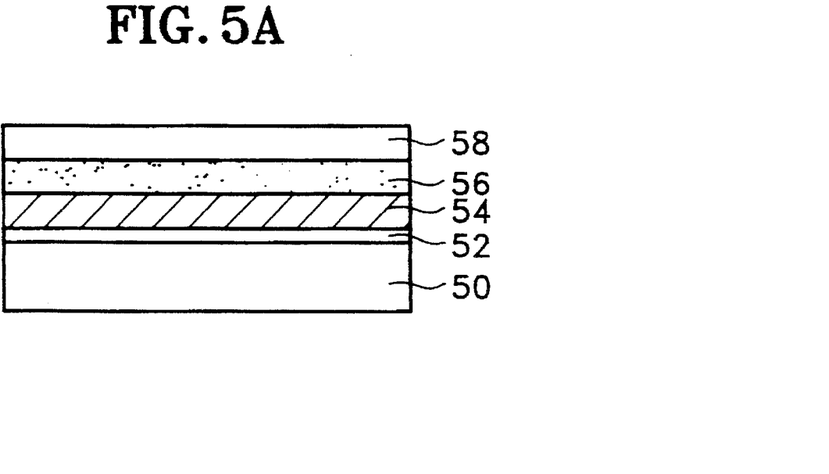
FIGS. 5A–5E are cross-sectional views depicting successive steps of a method for manufacturing a semiconductor device in accordance with a second preferred embodiment of the present invention.

With specific reference now to FIG. 5A, a gate insulating layer 52 is formed on a semiconductor substrate 50, e.g., by way of a thermal oxidation process. Then, an $n^+$-doped polysilicon layer 54 is formed on the gate insulating layer 52, to a thickness of 500–5,000 angstroms. Next, a refractory silicide layer, preferably a tungsten silicide (Wsix)layer 56 is formed on the doped polysilicon layer 54, to a thickness of 500–5,000 angstroms, e.g., by way of an ordinary CVD process. Subsequently, an insulating material, e.g., a high-temperature oxide (HTO), is deposited on the tungsten silicide layer 56, to a thickness of 500–3,000 angstroms, e.g., by way of an ordinary CVD process, to thereby form an insulating layer 58.

Figure 5B:
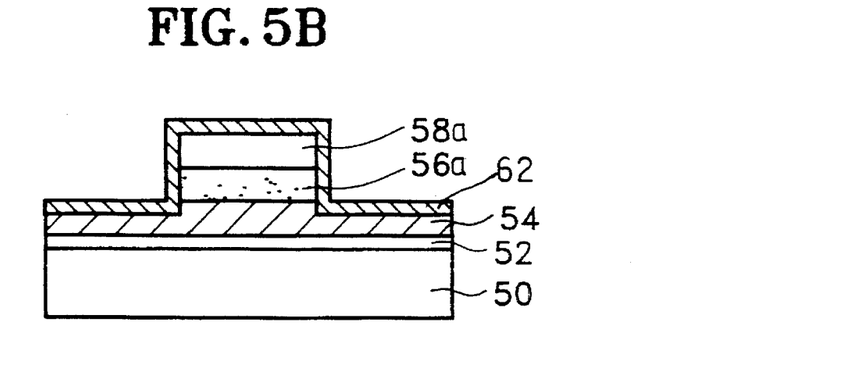

With reference now to FIG. 5B, the insulating layer 58 and the tungsten silicide layer 56 are sequentially etched, e.g., by way of a standard photolithographic process, in such a manner as to form a gate-patterned insulating layer 58a and a gate-patterned tungsten silicide layer 56a. The tungsten silicide layer 56 is over-etched, and the doped polysilicon layer 54 is etched to a depth of 100–1,000 angstroms, to thereby from a step "a" in the doped polysilicon layer 54. Next, an insulating material, e.g., a nitride material, is deposited on the resultant structure, to a thickness of 50–500 angstroms, e.g., by way of a CVD process, to thereby form an oxidation-prevention layer 62.

Figure 5C:
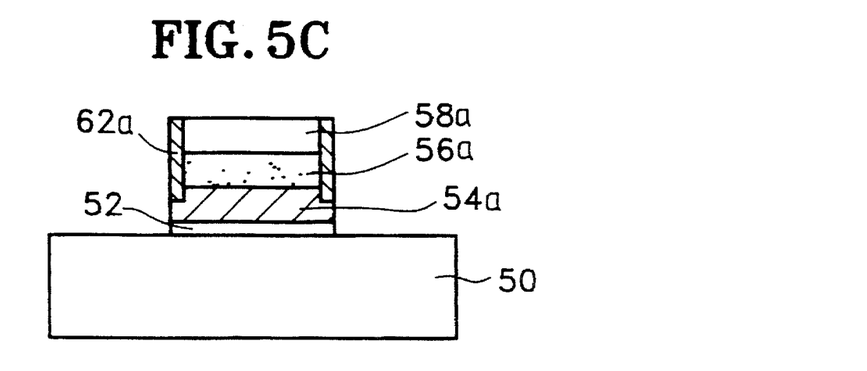

With specific reference now to FIG. 5C, the oxidation-prevention layer 62 is anisotropically etched to form an oxidation-prevention spacer 62a on the sidewalls of the gate-patterned insulating layer 58a, the sidewalls of the gate-patterned tungsten silicide layer 56a, and the sidewalls of an upper portion of the doped polysilicon layer 54 exposed by the step "a". Next, using the oxidation-prevention spacer 62a as an etching mask, the doped polysilicon layer 54 is etched, to thereby form a gate-patterned doped polysilicon layer 54a. The gate insulating layer 52 is also preferably etched so that its sidewalls are aligned with those of the gate-patterned doped polysilicon layer 54a. Together, the gate-patterned layers ("gate layers") 54a, 56a comprise a gate electrode.

Figure 5D:
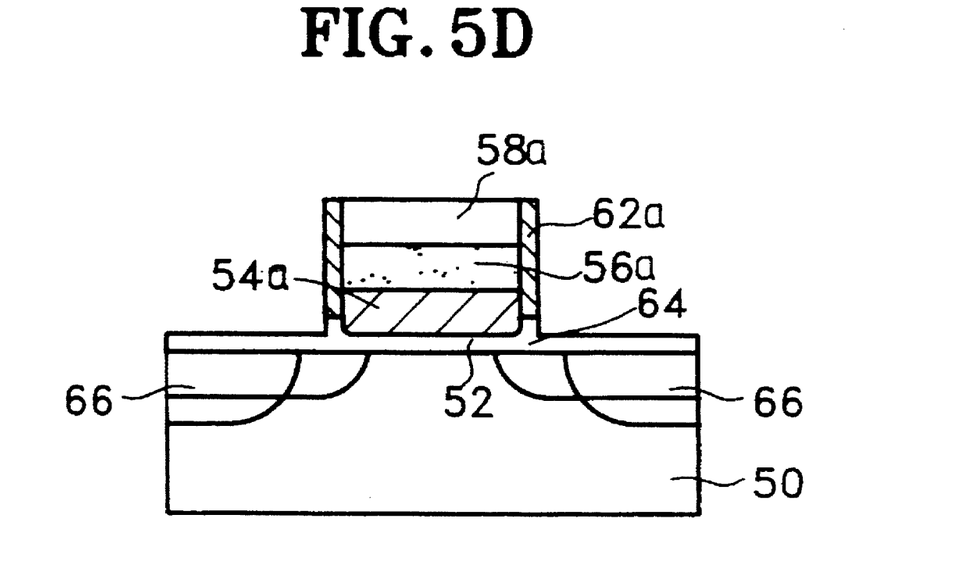

With specific reference now to FIG. 5D, the resultant structure of FIG. 5C is subjected to thermal oxidation, whereby the exposed step portion "a" of the polysilicon gate layer 54a and the exposed portions of the semiconductor substrate 50 (or, alternatively, if the gate insulating layer 52 is not etched in the previous step, then the exposed portions of the gate insulating layer 52) are oxidized inwardly to a depth of 50–500 angstroms, to thereby form an oxide layer 64. The tungsten silicide gate layer 56a and the upper portion of the polysilicon gate layer 54a are protected against oxidation by the oxidation-prevention spacer 62a. As can be seen, the oxdie layer 64 is formed thicker at the edges of the gate electrode in order to compensate for etch losses which occur when patterning the gate electrode. Next, $n^-$ impurities are ion-implanted into the semiconductor substrate 50 through the oxide layer 64, using the resultant structure as an ion-implantation mask, to thereby form $n^-$ source/drain regions 66 on opposite sides of the gate electrode.

Figure 5E:
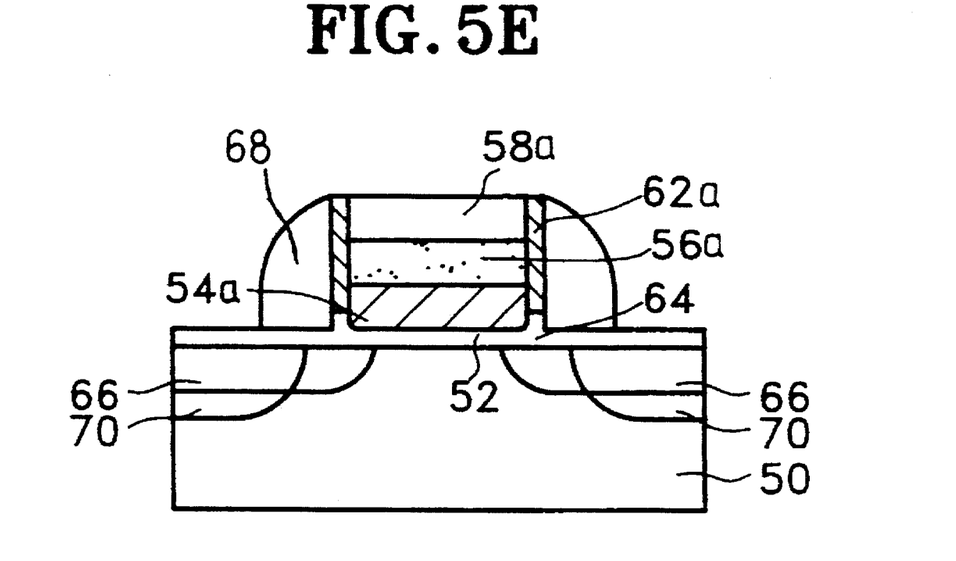

With specific reference now to FIG. 5E, an insulating material, e.g., an oxide material, is deposited on the resultant structure depicted in FIG. 5D, to a thickness of 500–3,000 angstroms. The thusly-obtained insulating layer (not shown in its entirety) is anisotropically etched to thereby from a spacer 68 on the sidewalls of the oxide prevention spacer 62a. Next, $n^+$ impurities are ion-implanted into the semiconductor substrate 50 through the oxide layer 64, using the spacer 68 as an ion-implantation mask, to thereby form $n^+$ source/drain regions 70 on opposite sides of the gate electrode. The source/drain regions 66, 70 and the gate electrode together comprise a lightly doped drain (LDD) transistor. It should be recognized, however, that the steps depicted in FIGS. 5D and 5E for forming a lightly doped drain (LDD) transistor are only illustrative, as the present invention is not limited to the manufacture of any specific type of transistor or other type of semiconductor device (e.g., semiconductor diode, resistor, capacitor, memory cell, etc.).

With reference now to FIGS. 6A–6E, a method for manufacturing a semiconductor device in accordance with a third preferred embodiment of the present invention will now be described.

Figure 6A:
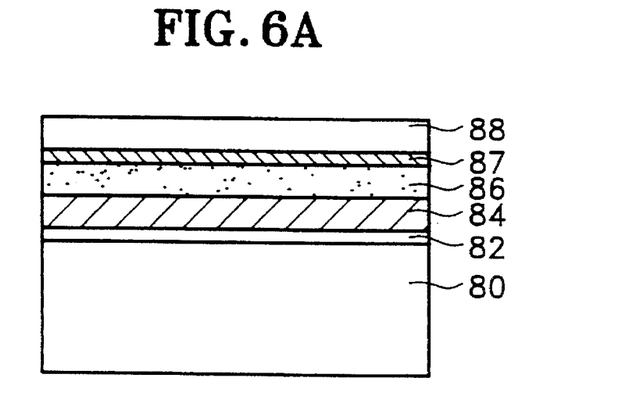
FIGS. 6A–6E are cross-sectional views depicting successive steps of a method for manufacturing a semiconductor device in accordance with a third preferred embodiment of the present invention.

With specific reference now to FIG. 6A, a gate insulating layer 82 is formed on a semiconductor substrate 80, e.g., by way of a thermal oxidation process. Then, an $n^+$-doped polysilicon layer 84 is formed on the gate insulating layer 82, to a thickness of 500–5,000 angstroms. Next, a refractory silicide layer, preferably a tungsten silicide (Wsix) layer 86 is formed on the doped polysilicon layer 84, to a thickness of 500–5,000 angstroms, e.g., by way of an ordinary CVD process. Then, an oxidation-resistant material, e.g., a nitride material, is deposited on the tungsten silicide layer 86, to thereby form a first oxidation-prevention layer 87. Subsequently, an insulating material, e.g., oxide, is deposited on the first oxidation-prevention layer 87, e.g., by way of an ordinary CVD process, to thereby form an insulating layer 88.

Figure 6B:
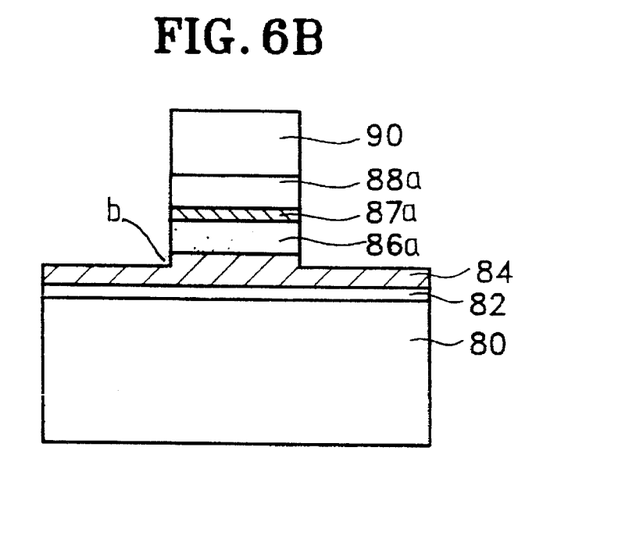

With specific reference now to FIG. 6B, a photoresist pattern 90 for defining a gate electrode is formed on the insulating layer 88, e.g., by way of a standard photolithographic process. Next, the insulating layer 88, the first oxidation-prevention layer 87, and the tungsten silicide layer 86 are sequentially etched, preferably by means of a dry etching method, to thereby form a gate-patterned insulating layer 88a, a gate-patterned first oxidation-prevention layer 87a, and a gate-patterned tungsten silicide layer 86a. The tungsten silicide layer 86 is over-etched, and the, the doped polysilicon layer 84 is etched to a depth of 100–1,000 angstroms, to thereby form a step "b" in the doped polysilicon layer 84.

Figure 6C:
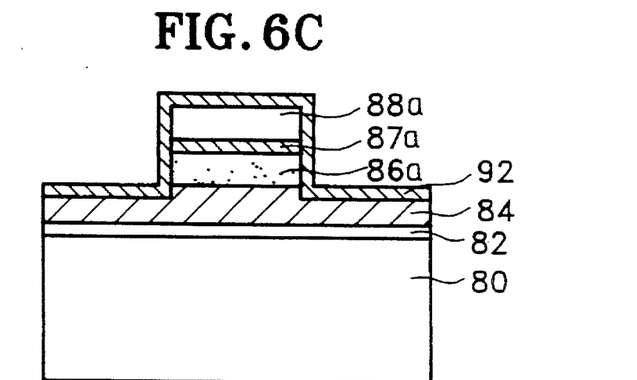

With specific reference now to FIG. 6C, the photoresist pattern 90 is removed, and then, an insulating material, e.g., a nitride material, is deposited on the resultant structure, to a thickness of 50–500 angstroms, e.g., by way of a CVD method, to thereby form a second oxidation-prevention layer 92.

Figure 6D:
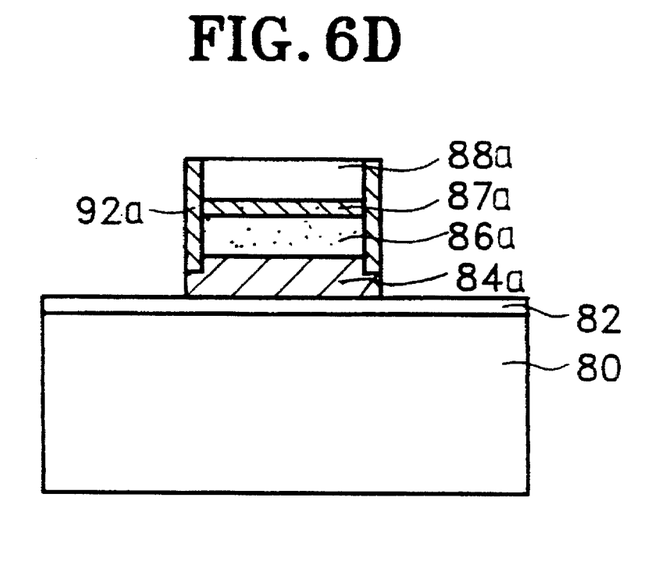

With specific reference now to FIG. 6D, the second oxidation-prevention layer 92 is anisotropically etched to form an oxidation-prevention spacer 92a on the sidewalls of the gate-patterned insulating layer 88a, the sidewalls of the gate-patterned first oxidation-prevention layer 87a, the sidewalls of the gate-patterned tungsten silicide layer 86a, and the sidewalls of an upper portion of the doped polysilicon layer 84 exposed by the step "b". Next, using the oxidation-prevention spacer 92a as an etching mask, the doped polysilicon layer 84 is etched, to thereby form a gate-patterned doped polysilicon layer 84a. Together, the gate-patterned layers ("gate layers") 84a, 86a comprise a gate electrode.

Figure 6E:
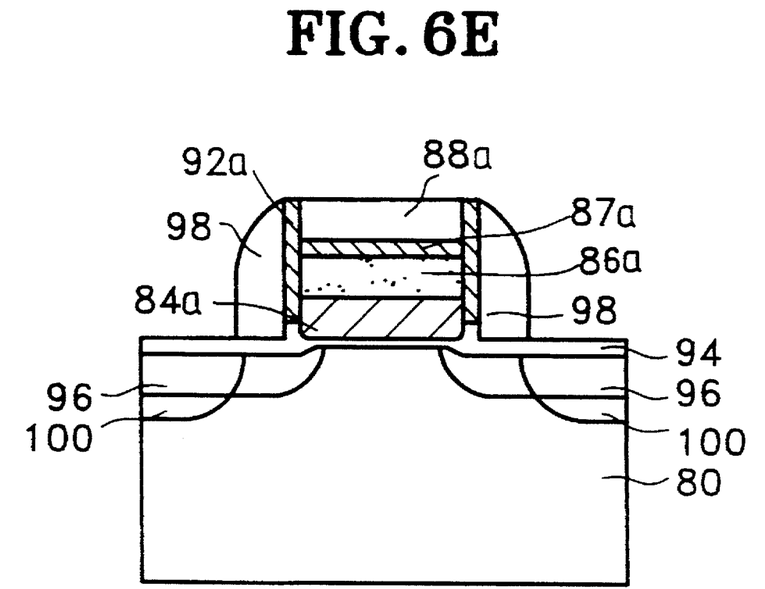

With specific reference now to FIG. 6E, the resultant structure of FIG. 6D is subjected to thermal oxidation, whereby the exposed step portion "b" of the polysilicon gate layer 84a and the exposed portions of the oxide layer 82 are oxidized inwardly to a depth of 50–500 angstroms, to thereby form an oxide layer 94. The tungsten silicide gate layer 86a and the upper portion of the polysilicon gate layer 84a are protected against oxidation by the first oxidation-prevention layer 87a and the oxidation-prevention spacer 92a. As can be seen, the oxide layer 94 is formed thicker on the edges of the gate electrode in order to compensate for etch losses which occur when patterning the gate electrode. Next, n⁻ impurities are ion-implanted into the semiconductor substrate 80 through the oxide layer 94, using the resultant structure as an ion-implantation mask, to thereby form n⁻ source/drain regions 96 on opposite sides of the gate electrode. Next, an insulating material, e.g., an oxide material, is deposited on the resultant structure, to a thickness of 500–3,000 angstroms. The thusly obtained insulating layer (not shown in its entirety) is anisotropically etched to thereby form a spacer 98 on the sidewalls of the oxidation-prevention spacer 92a. Next, n⁺ impurities are ion-implanted into the semiconductor substrate 80 through the oxide layer 94, using the spacer 98 as an ion-implantation mask, to thereby form n⁺ source/drain regions 100 on opposite sides of the gate electrode. The source/drain regions 96, 100 and the gate electrode together comprise a lightly doped drain (LDD) transistor. It should be recognized, however, that the steps depicted in FIG. 6E for forming a lightly doped drain (LDD) transistor are only illustrative, as the present invention is not limited to the manufacture of any specific type of transistor or other type of semiconductor device (e.g., semiconductor diode, resistor, capacitor, memory cell, etc.).

With reference now to FIGS. 7A–7E, a method for manufacturing a semiconductor device in accordance with a fourth preferred embodiment of the present invention will now be described.

Figure 7A:
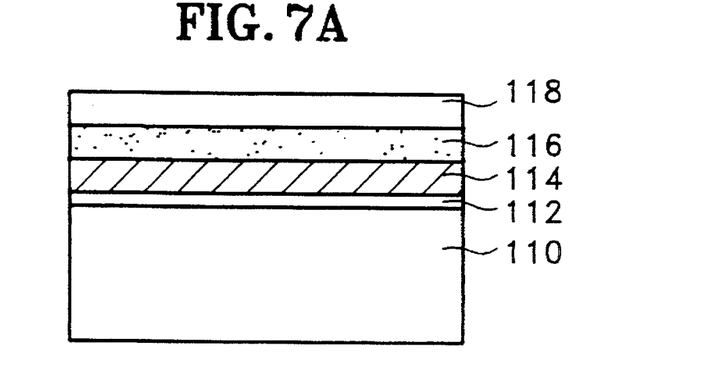
FIGS. 7A–7F are cross-sectional views depicting successive steps of a method for manufacturing a semiconductor device in accordance with a fourth preferred embodiment of the present invention.

With specific reference now to FIG. 7A, a gate insulating layer 112 is formed on a semiconductor substrate 110, e.g., by way of a thermal oxidation process. Then, an n⁺-doped polysilicon layer 114 is formed on the gate insulating layer 112, to a thickness of 500–5,000 angstroms. Next, a refractory silicide layer, preferably a tungsten silicide (Wsix) layer 116 is formed on the doped polysilicon layer 114, to a thickness of 500–5,000 angstroms, e.g., by way of an ordinary CVD process. Then, an insulating material, e.g., oxide, is deposited on the tungsten silicide layer 116, e.g., by way of an ordinary CVD process, to thereby form an insulating layer 118.

Figure 7B:
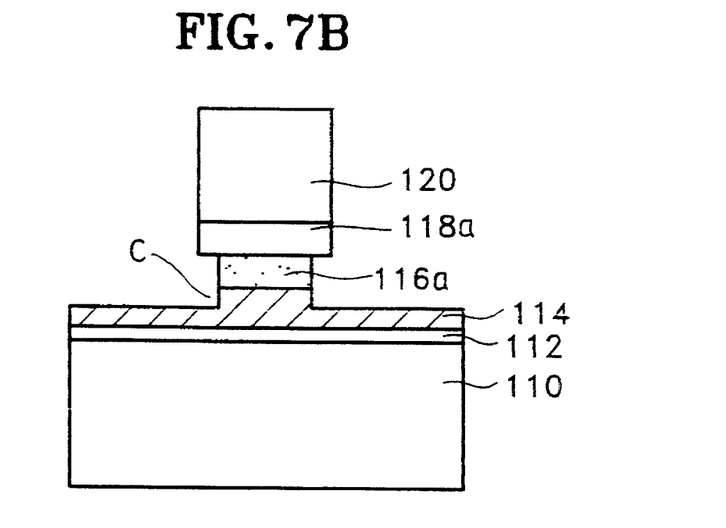

With specific reference now to FIG. 7B, a photoresist pattern 120 for defining a gate electrode is formed on the insulating layer 118, e.g., by way of a standard photolithographic process. Next, using the photoresist pattern 120 as an etching mask, the insulating layer 118 and the tungsten silicide layer 116 are sequentially etched, preferably using a dry etching technique. The tungsten silicide layer 116 is undercut-etched, and the etching is continued until the doped polysilicon layer 114 is etched to a depth of 100–1,000 angstroms, to thereby form a step "c" in the doped polysilicon layer 114. The undercut-etching can be carried out by using a SCI solution for 10–30 minutes, e.g., using an SCI solution comprised of $NH_4OH:H_2O_2:H_2O$ in a 1:2:3 volume ratio. Alternatively, a dry etching technique may be employed.

Figure 7C:
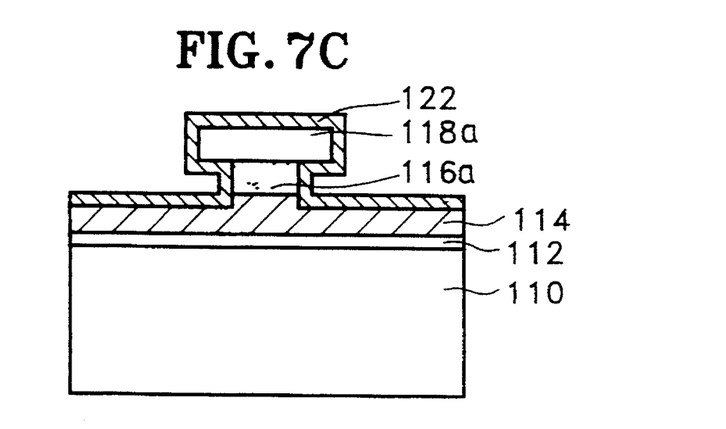

With specific reference now to FIG. 7C, the photoresist pattern 120 is removed, and then, an oxidation-resistant material, e.g., a nitride material, is deposited on the resultant structure, to a thickness of 50–500 angstroms, to thereby form an oxidation-prevention layer 122.

Figure 7D:
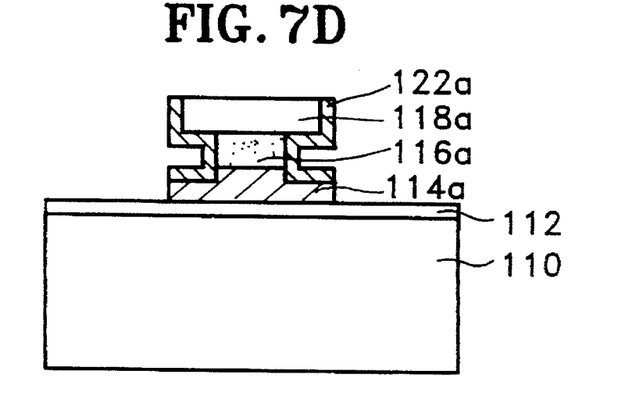

With specific reference now to FIG. 7D, the oxidation-prevention layer 122 is anisotropically etched to form an oxidation-prevention spacer 122a on the sidewalls of the gate-patterned insulating layer 118a, the sidewalls of the gate-patterned tungsten silicide layer 116a, and the sidewalls of an upper portion of the doped polysilicon layer 114 where the step "c" is formed. Next, using the oxidation-prevention spacer 122a as an etching mask, the doped polysilicon layer 114 is etched, to thereby form a gate-patterned doped polysilicon layer 114a. Together, the gate-patterned ("gate") layers 114a, 116a comprise a gate electrode.

Figure 7E:
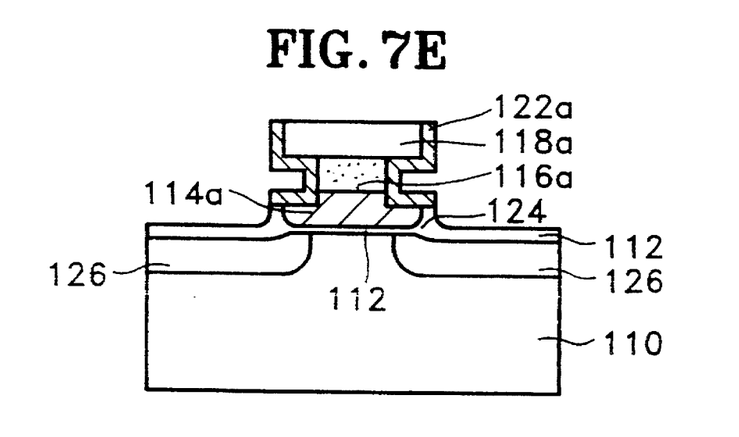
Figure 7F:
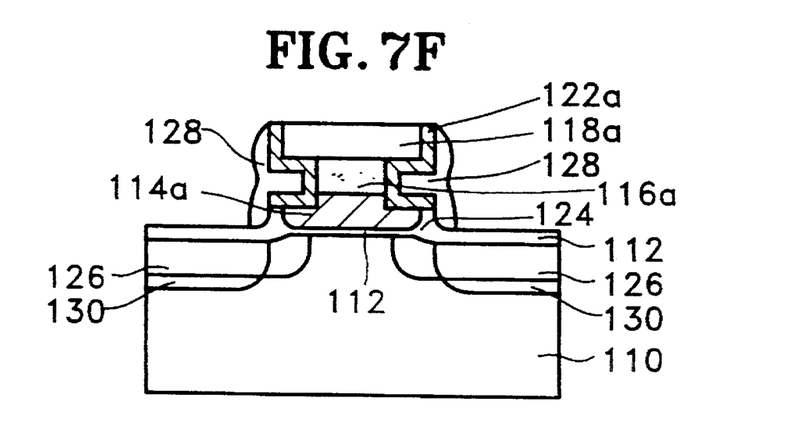

With specific reference to FIG. 7E, the resultant structure of FIG. 7D is subjected to thermal oxidation, whereby the exposed step portion "c" of the polysilicon gate layer 114a and the exposed portions of the gate insulating layer 112 are oxidized inwardly to a depth of 50–500 angstroms, to thereby form a completed oxide layer 112. The tungsten silicide gate layer 116a and the upper portion of the polysilicon gate layer 114a are protected against oxidation by the oxidation-prevention spacer 122a. As can be seen, the oxide layer 112 is formed thicker on the edges of the gate electrode in order to compensate for etch losses which occur when patterning the gate electrode. Next, n⁻ impurities are ion-implanted into the semiconductor substrate 110 through the oxide layer 112, using the resultant structure as an ion-implantation mask, to thereby form n⁻ source/drain regions 126 on opposite sides of the gate electrode. Next, an insulating material, e.g., an oxide material, is deposited on the resultant structure, to a thickness of 500–3,000 angstroms. The thusly obtained insulating layer (not shown in its entirety) is anisotropically etched to thereby form a spacer 128 on the sidewalls of the oxidation-prevention spacer 122a. Next, $n^+$ impurities are ion-implanted into the semiconductor substrate 110 through the oxide layer 112, using the spacer 128 as an ion-implantation mask, to thereby form $n^+$ source/drain regions 130 on opposite sides of the gate electrode. The source/drain regions 126, 130 and the gate electrode together comprise a lightly doped drain (LDD) transistor. It should be recognized, however, that the steps depicted in FIG. 7E for forming a lightly doped drain (LDD) transistor are only illustrative, as the present invention is not limited to the manufacture of any specific type of transistor or other type of semiconductor device (e.g., semiconductor diode, resistor, capacitor, memory cell, etc.).

Figure 8:
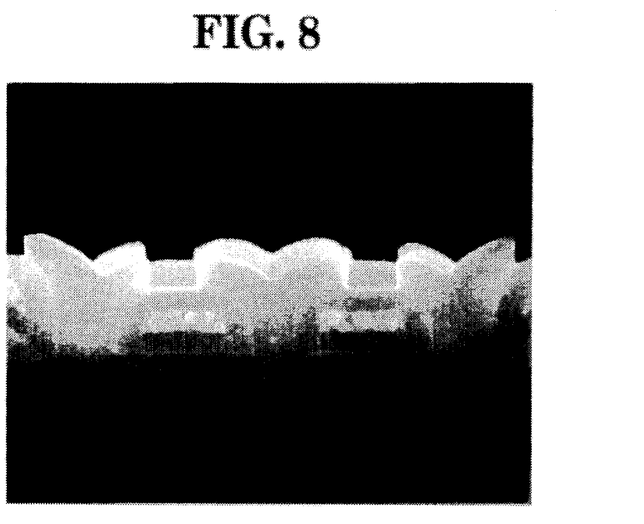
FIG. 8 is an SEM photograph depicting the gate electrode of a semiconductor device manufactured in accordance with the method of the present invention; and, FIG. 9 is a graph depicting the breakdown voltage characteristic of the gate insulating layer of a semiconductor device manufactured in accordance with the method of the present invention.
Figure 9:
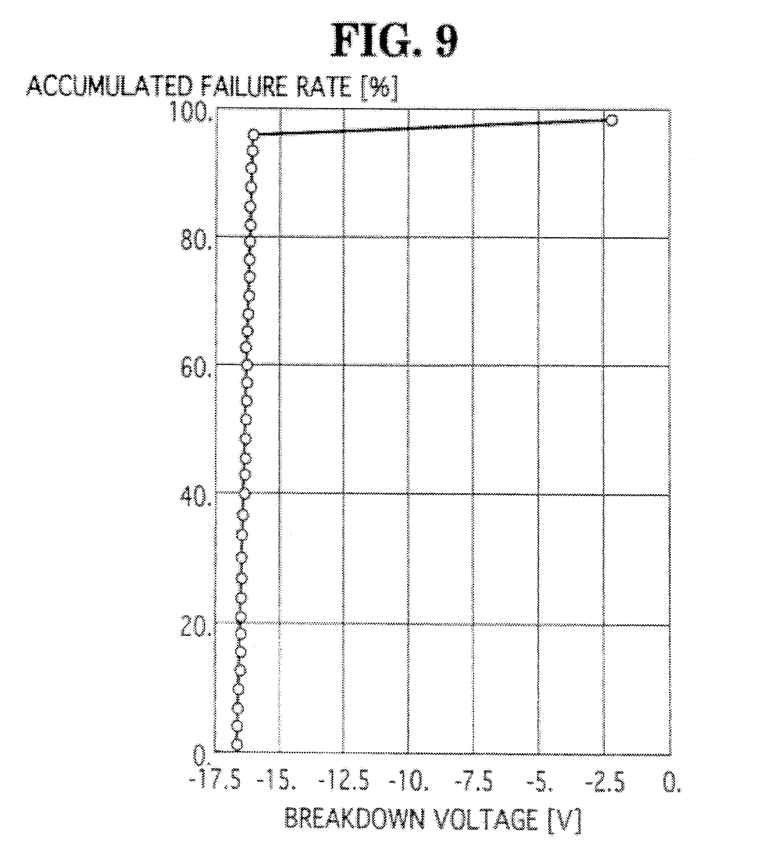

With reference now to FIG. 8, there can be seen an SEM photograph of a semiconductor device fabricated by using the method of the present invention. As can be seen, the exposed portion of the tungsten silicide gate is protected by the oxidation-prevention spacer from thermal oxidation, so that the thermal oxide layer is formed on only the exposed portions of the polysilicon gate and gate insulating layer. Consequently, the gate insulating layer exhibits the excellent characterstics depicted in FIG. 9. For example, with reference to FIG. 9, the gate insulating layer of the device made by the method of the present invention has a failure rate of less than 5% at a breakdown voltage level of 12.5 V, while the gate insulating layer of a device made by the conventional technology depicted in FIGS. 1A–C is about 20% at the same breakdown voltage level.

As will be appreciated by those skilled in the art, the method of the present invention prevents the refractory silicide gate layer from being oxidized, and only oxidizes the sidewalls of the doped polysilicon gate layer. Therefore, silicide can be used as a constituent material of the gate electrode so that a very low-resistance gate electrode can be obtained without the disadvantages of the prior art refractory silicide gates, such as the production of unwanted fringe electric fields at the edges of the gate when a voltage is applied thereto. Further, the reliability of the gate insulating layer of devices made by the method of the present invention significantly decreases the malfunction/failure rate thereof.

Although several preferred embodiments of the present invention have been described in detail hereinabove, it should be clearly understood by that many variations and/or modifications of the basic inventive concepts herein taught which may appear to those skilled in the art will still fall within the spirit and scope of the present invention as defined in the appended claims.

What is claimed is:

1. A method for manufacturing a semiconductor device, comprising the steps of:

forming a gate insulating layer on a semiconductor substrate;

forming a polysilicon layer on said gate insulating layer;

forming a silicide layer on said polysilicon layer;

etching said silicide layer to form a gate-patterned silicide layer, and over-etching said silicide layer to partially etch said polysilicon layer, to thereby form a step in said polysilicon layer;

forming an oxidation-prevention spacer on sidewalls of said gate-patterned silicide layer and sidewalls of said polysilicon layer exposed by said step;

etching said polysilicon layer, using said oxidation-prevention spacer as an etching mask, to thereby form a gate-patterned polysilicon layer, said gate-patterned silicide layer and said gate-patterned polysilicon layer together comprising a gate electrode;

thermally oxidizing exposed portions of said gate insulating layer and exposed portions of said polysilicon layer, to thereby form an oxide layer; and, ion-implanting first impurities into said semiconductor substrate, using the resultant structure from the previously-recited steps as an ion-implantation mask, to thereby form source/drain regions in said semiconductor substrate, on opposite sides of said gate electrode.

2. The method as set forth in claim 1, further comprising the steps of:

forming a further spacer on sidewalls of said oxidation-prevention spacer; and, ion-implanting second impurities into said semiconductor substrate, to a greater depth than said first impurities, using said further spacer as an ion-implantation mask, to thereby form deeper source/drain regions in said semiconductor substrate, on opposite sides of said gate electrode.

3. The method as set forth in claim 2, wherein said first impurities are $n^-$ impurities, and said second impurities are $n^+$ impurities.

4. The method as set forth in claim 1, wherein said silicide layer comprises a refractory silicide layer.

5. The method as set forth in claim 4, wherein said refractory silicide layer comprises a tungsten silicide layer.

6. The method as set forth in claims 1 or 4, wherein said oxidation-prevention spacer is comprised of a nitride material.

7. A method for manufacturing a semiconductor device, comprising the steps of:

forming a gate insulating layer on a semiconductor substrate;

forming a polysilicon layer on said gate insulating layer;

forming a silicide layer on said polysilicon layer;

forming an oxidation-prevention layer on said silicide layer;

etching said oxidation-prevention layer and silicide layer to form a gate-patterned oxidation prevention layer and a gate-patterned silicide layer, and over-etching said silicide layer to partially etch said polysilicon layer, to thereby form a step in said polysilicon layer;

forming an oxidation-prevention spacer on sidewalls of said gate-patterned oxidation-prevention layer, sidewalls of said gate-patterned silicide layer, and sidewalls of said polysilicon layer exposed by said step;

etching said polysilicon layer, using said oxidation-prevention spacer as an etching mask, to thereby form a gate-patterned polysilicon layer, said gate-patterned silicide layer and said gate-patterned polysilicon layer together comprising a gate electrode;

thermally oxidizing exposed portions of said gate insulating layer and exposed portions of said polysilicon layer, to thereby form an oxide layer; and, ion-implanting first impurities into said semiconductor substrate, using the resultant structure from the previously-recited steps as an ion-implantation mask, to thereby form source/drain regions in said semiconductor substrate, on opposite sides of said gate electrode.

8. The method as set forth in claim 7, further comprising the steps of:

forming a further spacer on sidewalls of said oxidation-prevention spacer; and, ion-implanting second impurities into said semiconductor substrate, to a greater depth than said first impurities, using said further spacer as an ion-implantation mask, to thereby form deeper source/drain regions in said semiconductor substrate, on opposite sides of said gate electrode.

9. The method as set forth in claim 8, wherein said first impurities are n⁻ impurities, and said second impurities are n⁺ impurities.

10. The method as set forth in claim 7, wherein said silicide layer comprises a refractory silicide layer.

11. The method as set forth in claim 10, wherein said refractory silicide layer comprises a tungsten silicide layer.

12. The method as set forth in claims 7 or 10, wherein said oxidation-prevention spacer is comprised of a nitride material.

13. The method as set forth in claims 7 or 10, wherein said oxidation-prevention layer is comprised of a nitride material.

14. A method for manufacturing a semiconductor device, comprising the steps of:

forming a gate insulating layer on a semiconductor substrate;

forming a polysilicon layer on said gate insulating layer;

forming a silicide layer on said polysilicon layer;

forming an insulating layer on said silicide layer;

etching said insulating layer and silicide layer to form a gate-patterned insulating layer and a gate-patterned silicide layer, and over-etching said silicide layer to partially etch said polysilicon layer, to thereby form a step in said polysilicon layer;

forming an oxidation-prevention spacer on sidewalls of said gate-patterned insulating layer, sidewalls of said gate-patterned silicide layer, and sidewalls of said polysilicon layer exposed by said step;

etching said polysilicon layer, using said oxidation-prevention spacer as an etching mask, to thereby form a gate-patterned polysilicon layer, said gate-patterned silicide layer and said gate-patterned polysilicon layer together comprising a gate electrode;

thermally oxidizing exposed portions of said gate insulating layer and exposed portions of said polysilicon layer, to thereby form an oxide layer; and, ion-implanting first impurities into said semiconductor substrate, using the resultant structure from the previously-recited steps as an ion-implantation mask, to thereby form source/drain regions in said semiconductor substrate, on opposite sides of said gate electrode.

15. The method as set forth in claim 14, further comprising the steps of:

forming a further spacer on sidewalls of said oxidation-prevention spacer; and, ion-implanting second impurities into said semiconductor substrate, to a greater depth than said first impurities, using said further spacer as an ion-implantation mask, to thereby form deeper source/drain regions in said semiconductor substrate, on opposite sides of said gate electrode.

16. The method as set forth in claim 15, wherein said first impurities are n⁻ impurities, and said second impurities are n⁺ impurities.

17. The method as set forth in claim 14, wherein said silicide layer comprises a refractory silicide layer.

18. The method as set forth in claim 17, wherein said refractory silicide layer comprises a tungsten silicide layer.

19. The method as set forth in claims 14 or 17, wherein said oxidation-prevention spacer is comprised of a nitride material.

20. The method as set forth in claims 14 or 17, wherein said insulating layer is comprised of an oxide material.

21. A method for manufacturing a semiconductor device, comprising the steps of:

forming a gate insulating layer on a semiconductor substrate;

forming a polysilicon layer on said gate insulating layer;

forming a silicide layer on said polysilicon layer;

forming an oxidation-prevention layer on said silicide layer;

forming an insulating layer on said oxidation-prevention layer;

etching said insulating layer, said oxidation-prevention layer and silicide layer to form a gate-patterned insulating layer, a gate-patterned oxidation prevention layer and a gate-patterned silicide layer, and over-etching said silicide layer to partially etch said polysilicon layer, to thereby form a step in said polysilicon layer;

forming an oxidation-prevention spacer on sidewalls of said gate-patterned insulating layer, sidewalls of said gate-patterned oxidation-prevention layer, sidewalls of said gate-patterned silicide layer, and sidewalls of said polysilicon layer exposed by said step;

etching said polysilicon layer, using said oxidation-prevention spacer as an etching mask, to thereby form a gate-patterned polysilicon layer, said gate-patterned silicide layer and said gate-patterned polysilicon layer together comprising a gate electrode;

thermally oxidizing exposed portions of said gate insulating layer and exposed portions of said polysilicon layer, to thereby form an oxide layer; and, ion-implanting first impurities into said semiconductor substrate, using the resultant structure from the previously-recited steps as an ion-implantation mask, to thereby form source/drain regions in said semiconductor substrate, on opposite sides of said gate electrode, 22. The method as set forth in claim 21, further comprising the steps of:

forming a further spacer on sidewalls of said oxidation-prevention spacer; and, ion-implanting second impurities into said semiconductor substrate, to a greater depth than said first impurities, using said further spacer as an ion-implantation mask, to thereby form deeper source/drain regions in said semiconductor substrate, on opposite sides of said gate electrode, 23. The method as set forth in claim 22, wherein said first impurities are n⁻ impurities, and said second impurities are n⁺ impurities.

24. The method as set forth in claim 21, wherein said silicide layer comprises a refractory silicide layer.

25. The method as set forth in claim 24, wherein said refractory silicide layer comprises a tungsten silicide layer.

26. The method as set forth in claims 21 or 23, wherein said oxidation-prevention spacer is comprised of a nitride material.

27. The method as set forth in claims 21 or 23, wherein said insulating layer is comprised of an oxide material, and said oxidation-prevention layer is comprised of a nitride material.

28. A method for manufacturing a semiconductor device, comprising the steps of:

forming a gate insulating layer on a semiconductor substrate;

forming a polysilicon layer on said gate insulating layer;

forming a silicide layer on said polysilicon layer;

forming an insulating layer on said silicide layer;

etching said insulating layer and said silicide layer, to form a gate-patterned insulating layer;

undercut-etching said silicide layer to form a gate-patterned silicide layer having a lesser width than that of said gate-patterned insulating layer, and over-etching said silicide layer to partially etch said polysilicon layer, to thereby form a step in said polysilicon layer;

forming an oxidation-prevention spacer on sidewalls of said gate-patterned insulating layer, sidewalls of said gate-patterned silicide layer, and sidewalls of said polysilicon layer exposed by said step;

etching said polysilicon layer, using said oxidation-prevention spacer as an etching mask, to thereby form a gate-patterned polysilicon layer, said gate-patterned silicide layer and said gate-patterned polysilicon layer together comprising a gate electrode;

thermally oxidizing exposed portions of said gate insulating layer and exposed portions of said polysilicon layer, to thereby form an oxide layer; and, ion-implanting first impurities into said semiconductor substrate, using the resultant structure from the previously-recited steps as an ion-implantation mask, to thereby form source/drain regions in said semiconductor substrate, on opposite sides of said gate electrode.

29. The method as set forth in claim 28, further comprising the steps of:

forming a further spacer on sidewalls of said oxidation-prevention spacer; and, ion-implanting second impurities into said semiconductor substrate, to a greater depth than said first impurities, using said further spacer as an ion-implantation mask, to thereby form deeper source/drain regions in said semiconductor substrate, on opposite sides of said gate electrode.

30. The method as set forth in claim 29, wherein said first impurities are $n^-$ impurities, and said second impurities are $n^+$ impurities.

31. The method as set forth in claim 28, wherein said silicide layer comprises a refractory silicide layer.

32. The method as set forth in claim 31, wherein said refractory silicide layer comprises a tungsten silicide layer.

33. The method as set forth in claims 28 or 30, wherein said oxidation-prevention spacer is comprised of a nitride material.

* * * * *